(12) United States Patent
Shoji et al.

(10) Patent No.: US 12,360,150 B2
(45) Date of Patent: Jul. 15, 2025

(54) TESTING METHOD AND MANUFACTURING METHOD

(71) Applicant: FUJI ELECTRIC CO., LTD., Kanagawa (JP)

(72) Inventors: Atsushi Shoji, Matsumoto (JP); Akira Nishimura, Suzuka (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 220 days.

(21) Appl. No.: 17/867,689

(22) Filed: Jul. 19, 2022

(65) Prior Publication Data

US 2023/0069188 A1 Mar. 2, 2023

(30) Foreign Application Priority Data

Sep. 1, 2021 (JP) ................. 2021-142337

(51) Int. Cl.
*G01R 31/26* (2020.01)

(52) U.S. Cl.
CPC ................. *G01R 31/2608* (2013.01)

(58) Field of Classification Search
CPC ............... G01R 31/26; G01R 31/2608; G01R 31/2644; G01R 31/21; G01R 31/00; G01R 31/52; G01R 31/003; H01L 29/7396; H01L 27/0255; H01L 29/0607; H01L 29/0623; H01L 29/0696; H01L 29/866; H01L 27/0248; H01L 23/34; H01L 29/861; H01L 27/0629; H01L 27/0727; H01L 29/407; H01L 29/4238; H01L 29/8613; H01L 29/0834; H01L 29/7397; H01L 23/60; H01L 22/34
See application file for complete search history.

(56) References Cited

U.S. PATENT DOCUMENTS

| | | | |
|---|---|---|---|
| 2016/0054749 A1* | 2/2016 | Fujiwara | G05F 1/575 323/273 |
| 2018/0138169 A1* | 5/2018 | Reiter | H01L 29/7396 |
| 2019/0064250 A1* | 2/2019 | Wang | H01L 22/14 |
| 2019/0273488 A1* | 9/2019 | Reiter | H02H 7/222 |
| 2021/0011090 A1 | 1/2021 | Sato | |

FOREIGN PATENT DOCUMENTS

JP 2021016246 A 2/2021

* cited by examiner

*Primary Examiner* — Son T Le (57) ABSTRACT

Provided is a testing method for testing a semiconductor device provided with a main element portion including a main transistor portion and a main diode portion, and a sensing transistor portion for current detection, the testing method having: operating an element by causing a diode operation of the sensing transistor portion in the semiconductor device in a chip or wafer state; measuring the element by measuring a voltage-current characteristic showing a relationship between a voltage between main terminals of the sensing transistor portion and a current flowing through the main terminals during the diode operation; and determining the element by determining a defectiveness of the semiconductor device based on the voltage-current characteristic.

21 Claims, 9 Drawing Sheets

TESTING METHOD AND MANUFACTURING METHOD

The contents of the following Japanese patent applications are incorporated herein by reference:
NO. 2021-142337 filed in JP on Sep. 1, 2021.

BACKGROUND

1. Technical Field

The present invention relates to a testing method and a manufacturing method of a semiconductor device.

2. Related Art

Conventionally, a semiconductor module for accommodating a semiconductor device such as an IGBT (Insulated Gate Bipolar Transistor) is known (for example, refer to Patent Document 1).

Patent Document 1: Japanese Patent Application Publication No. 2021-16246

DESCRIPTION OF EXEMPLARY EMBODIMENTS

Hereinafter, (some) embodiment(s) of the present invention will be described. The embodiment(s) do(es) not limit the invention according to the claims. And all the combinations of the features described in the embodiment(s) are not necessarily essential to means provided by aspects of the invention.

One side in a direction parallel to the depth direction of a semiconductor substrate (or a semiconductor device) is herein referred to as an "upper" side, and the other side is referred to as a "lower" side. One of two main surfaces of a substrate, a layer, or another member is referred to as an upper surface, and the other surface is referred to as a lower surface. "Upper" and "lower" directions are not limited to a direction of gravity, or a direction in which a semiconductor device is mounted.

In the present specification, a case where a term such as "same" or "equal" is mentioned may include a case where an error due to a variation in manufacturing or the like is included. The error is, for example, within 10%.

Figure 1:
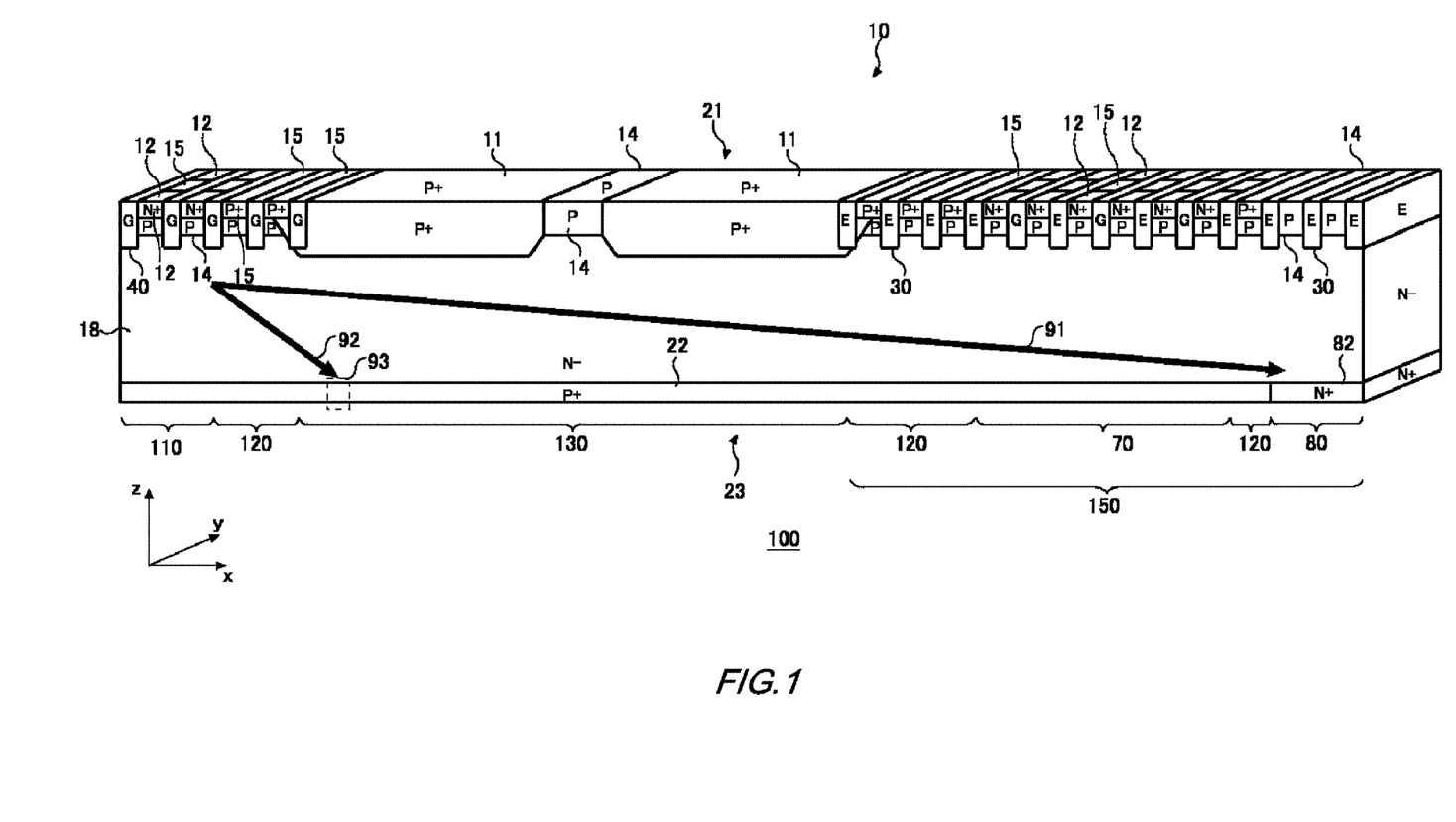
FIG. 1 illustrates a perspective cross-sectional view describing an outline of a semiconductor device 100 under test.

FIG. 1 illustrates a perspective cross-sectional view describing an outline of a semiconductor device 100 under test. In FIG. 1, a partial perspective cross-sectional view of the semiconductor device 100 is illustrated. The semiconductor device 100 is an apparatus where a semiconductor element such as a transistor is formed on a semiconductor substrate 10. The semiconductor substrate 10 is a substrate formed of a semiconductor material such as silicon. The semiconductor device 100 may be in a state of a wafer with a plurality of chips formed, or may be in a state of a chip cut from a wafer. The semiconductor device 100 includes an insulating film, electrodes and so on provided on an upper surface 21 and a lower surface 23 of the semiconductor substrate 10, but in FIG. 1, structures other than the semiconductor substrate 10 are omitted. In FIG. 1, the x axis and y axis are two orthogonal axes in the plane parallel to the upper surface 21 of the semiconductor substrate 10. And the axis perpendicular to the upper surface 21 is the z axis. In the present specification, the direction of the z axis may be referred to as a depth direction.

The semiconductor device 100 in the present example includes a main element portion 150 and a sensing transistor portion 110. The main element portion 150 includes a main transistor portion 70 and a main diode portion 80. The main transistor portion 70 may include, for example, IGBT element, or may include other transistors. The main diode portion 80 includes a reflux diode provided in anti-parallel with the main transistor portion 70. The semiconductor device 100 in the present example is a so-called reverse conducting IGBT (RC-IGBT).

The sensing transistor portion 110 is provided to detect a current flowing through the main element portion 150. The sensing transistor portion 110 has a structure similar to that of the main transistor portion 70, to which a control signal (for example, a gate voltage) input into the main transistor portion 70 is similarly input. Note that, in the xy plane, the area occupied by the sensing transistor portion 110 is smaller than the area occupied by the main transistor portion 70. The area of the sensing transistor portion 110 may be 1% or less, or may be 0.1% or less of the area of the main transistor portion 70. The magnitude of the current flowing through the sensing transistor portion 110 is the magnitude of a current flowing through the main transistor portion 70 multiplied by the value corresponding to the area ratio described above. Therefore, by measuring the current flowing through the sensing transistor portion 110, the magnitude of the current flowing through the main transistor portion 70 can be estimated.

The semiconductor device 100 in the present example further includes boundary portions 120 and a separating portion 130. The boundary portions 120 are provided on end portions of the main transistor portion 70, the main diode portion 80 and the sensing transistor portion 110 in the xy plane. Also, the separating portion 130 is arranged between the sensing transistor portion 110 and the main element portion 150 in the xy plane.

The semiconductor substrate 10 has a drift region 18 of an N− type. The drift region 18 is provided in each of the main element portion 150, the sensing transistor portion 110, the separating portion 130 and the boundary portions 120.

On the upper surface 21 side of the semiconductor substrate 10, one or more gate trench portions 40 and one or more dummy trench portions 30 are provided. In the present specification, the gate trench portion 40 and the dummy trench portion 30 may be referred to as a trench portion.

Inside the trench portion, a conductive member such as polysilicon and an insulating film that insulates the conductive member and the semiconductor substrate 10 are provided. The gate trench portion 40 is electrically connected to the gate electrode arranged above the upper surface 21 of the semiconductor substrate 10. The gate trench portion 40 functions as a gate electrode to which a gate voltage is applied. No gate voltage is applied to the dummy trench portion 30 and it does not function as a gate electrode. The emitter electrode described below may be connected to the dummy trench portion 30. Each trench portion is provided in a depth direction from the upper surface 21 to the drift region 18 of the semiconductor substrate 10.

A plurality of trench portions are arranged in a predetermined interval along a predetermined array direction. In the example of FIG. 1, a plurality of trench portions are arrayed along the direction parallel to the x axis. Also the trench portions extend in a predetermined direction on the upper surface 21 of the semiconductor substrate 10. In the example of FIG. 1, the trench portions extend in the direction parallel to the y axis.

Each of the main transistor portion 70 and the main diode portion 80 has a plurality of trench portions. In the main transistor portion 70 of the present example, one or more gate trench portions 40 and one or more dummy trench portions 30 are provided alternately along the array direction. Note that the array of the trench portions in the main transistor portion 70 is not limited to this. In the main diode portion 80 of the present example, the plurality of dummy trench portions 30 are provided along the array direction. The gate trench portion 40 is not provided in the main diode portion 80 of the present example.

A mesa portion is provided between the respective trench portions in the array direction. The mesa portion of the present example is provided to extend in the y axis direction along the trench on the upper surface of the semiconductor substrate 10. In the mesa portion of the main transistor portion 70, emitter regions 12 of an N+ type and base regions 14 of a P type are provided in order from the upper surface 21 side of the semiconductor substrate 10. The emitter region 12 has a doping concentration higher than the drift region 18. The drift region 18 is provided below the base region 14.

The emitter region 12 is exposed from the upper surface 21 of the semiconductor substrate 10, and is provided to be in contact with the trench portion in the xy plane. The base region 14 is provided below the emitter region 12 and is provided to be in contact with the trench portion in the xy plane. The emitter region 12 and the base region 14 are connected electrically to the emitter electrode provided above the upper surface 21 of the semiconductor substrate 10. The base region 14 may be connected to the emitter electrode via the contact region 15 of the P+ type provided on the upper surface 21 of the semiconductor substrate 10. The doping concentration of the contact region 15 is higher than the doping concentration of the base region 14. On the upper surface 21 of the semiconductor substrate 10, the emitter regions 12 and the contact regions 15 may be arranged alternately along the y axis direction.

In the mesa portion of the main diode portion 80, the base region 14 of the P type is provided to be in contact with the upper surface 21 of the semiconductor substrate 10. The drift region 18 is provided below the base region 14.

Each trench portion reaches the drift region 18 penetrating the base region 14 from the upper surface 21 of the semiconductor substrate 10. In the region with the emitter region 12 provided, each trench portion may penetrate the emitter region 12 as well. When the predetermined gate voltage is applied to the gate trench portion 40, a channel is formed by the electron inversion layer on the surface layer of the interface that is in contact with the gate trench portion 40 in the base regions 14. A current flows through the channel between the emitter regions 12 and the drift region 18.

In the main transistor portion 70, in the region in contact with the lower surface 23 of the semiconductor substrate 10, a collector region 22 of the P+ type is provided. The doping concentration of the collector region 22 is higher than the doping concentration of the base region 14.

In the main diode portion 80, in the region in contact with the lower surface 23 of the semiconductor substrate 10, a cathode region 82 of the N+ type is provided. The doping concentration of the cathode region 82 is higher than the doping concentration of the drift region 18. The collector region 22 and the cathode region 82 are connected to the collector electrode provided on the lower surface 23 of the semiconductor substrate 10. The gate electrode, emitter electrode and collector electrode described above may be formed of a metallic material such as aluminum.

The sensing transistor portion 110 has a structure similar to the main transistor portion 70. Note that, in the sensing transistor portion 110, the dummy trench portion 30 may not be provided. Also above the sensing transistor portion 110, the sensing electrode is provided instead of the emitter electrode. The sensing electrode has functions and structures similar to those of the emitter electrode, and is separated from the emitter electrode.

In the boundary portion 120, one or more trench portions are provided. The trench portion provided in the boundary portion 120 may be a dummy trench portion 30, or may be a gate trench portion 40, or may be both of the dummy trench portion 30 and the gate trench portion 40. In the mesa portion of the boundary portion 120 in the present example is provided with the contact region 15 and the base region 14. The contact region 15 is exposed from the upper surface 21. The base region 14 is provided between the contact region 15 and the drift region 18. In the boundary portion 120, the collector region 22 in contact with the lower surface 23 of the semiconductor substrate 10 may be provided.

In the separating portion 130, a well region 11 of the P+ type is provided. The well region 11 has a doping concentration higher than the base region 14. Also the well region 11 is provided from the upper surface 21 to the position deeper than the trench portion in the semiconductor substrate 10. In the separating portion 130, the base region 14 sandwiched between the well regions 11 in the xy plane may be provided. By providing the separating portion 130, the movement of carriers between the sensing transistor portion 110 and the main element portion 150 are suppressed.

Figure 2:
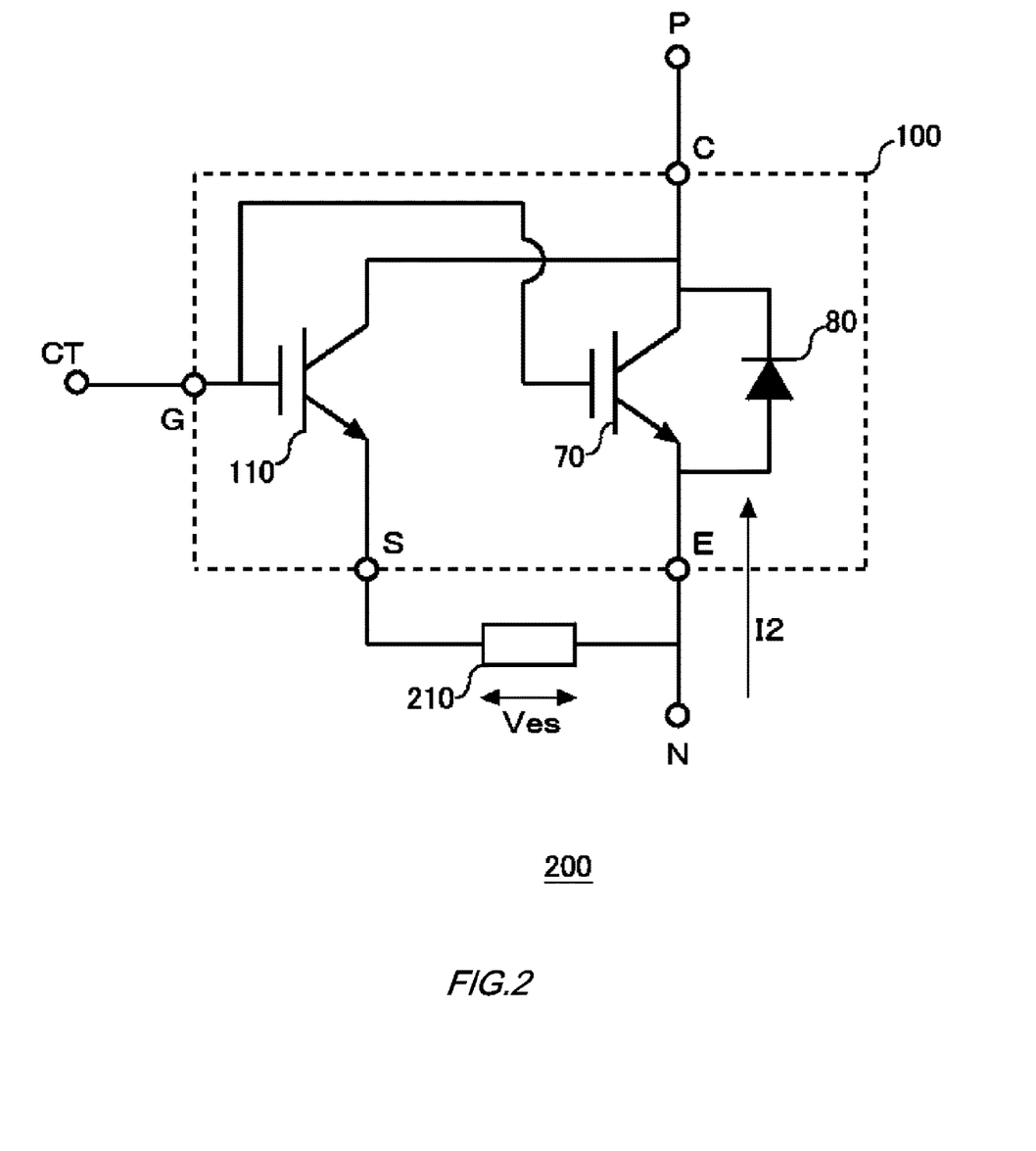
FIG. 2 illustrates a circuit diagram describing an outline of a semiconductor module 200 embedding the semiconductor device 100.

FIG. 2 illustrates a circuit diagram describing an outline of the semiconductor module 200 embedding the semiconductor device 100. The semiconductor module 200 may have a resin case accommodating the semiconductor device 100. In the resin case, the wiring pattern, terminal and electrical element that are connected to the semiconductor device 100 may be accommodated.

As described in FIG. 1, the semiconductor device 100 includes a main transistor portion 70, a main diode portion 80 and a sensing transistor portion 110. The main transistor portion 70 and the main diode portion 80 are connected in anti-parallel. That is, the emitter of the main transistor portion 70 is connected to the anode of the main diode portion 80, and the collector of the main transistor portion 70 is connected to the cathode of the main diode portion 80. In FIG. 2, the emitter electrode of the semiconductor device 100 is indicated by the terminal E, the collector electrode is indicated by the terminal C, the gate electrode is indicated by the terminal G, and the sensing electrode is indicated by the terminal S.

The semiconductor module 200 of the present example has the terminal P connected to the terminal C, the terminal N connected to the terminal E and the terminal CT connected to the terminal G. Also, the semiconductor module 200 has wiring connecting these terminals. Also, the semiconductor module 200 of the present example has a resistance 210 for current detection. The resistance 210 is connected between the terminal N and the terminal S. By measuring the drop voltage Ves in the resistance 210, the magnitude of the current flowing through the sensing transistor portion 110 can be detected. The resistance value of the resistance 210 is, for example, 100Ω or more.

As the test of the semiconductor module 200, it can be contemplated to detect the drop voltage Ves when a diode operation of the main element portion 150 is caused. The diode operation of the main element portion 150 refers to turning the main transistor portion 70 and the sensing transistor portion 110 to the OFF state, and causing a predetermined current to flow in the forward direction with respect to the main diode portion 80. In the test of the present example, the second test current I2 flows through the main diode portion 80. The second test current I2 is, for example, the rated current of the semiconductor device 100 during the diode operation.

Since the sensing transistor portion 110 is controlled to be in the OFF state, the current does not flow between the emitter region 12 and the collector region 22 in the sensing transistor portion 110. As shown in the current path 91 in FIG. 1, although the current flows through the base region 14 in the sensing transistor portion 110 and the cathode region 82 of the main diode portion 80 by the diode operation, since the current path 91 is extremely long, the current hardly flows. Accordingly, the drop voltage Ves is hardly generated.

On the other hand, when a defect 93 of the N type in the collector region 22 near the sensing transistor portion 110 is formed (refer to FIG. 1), the current flows by the diode operation of the base region 14 and the defect 93 in the sensing transistor portion 110. The current path 92 between the base region 14 and the defect 93 of the sensing transistor portion 110 is shorter than the current path 91. Therefore, the current in the current path 92 becomes relatively large, and the drop voltage Ves becomes larger. The defect 93 may be a region where the donor of the N type is implanted by mistake, or may be a portion with the drift region 18 remained due to the damage of the collector region 22. Current may flow between the defect 93 and the base region 14 of the sensing transistor portion 110 due to other reasons.

Figure 3:
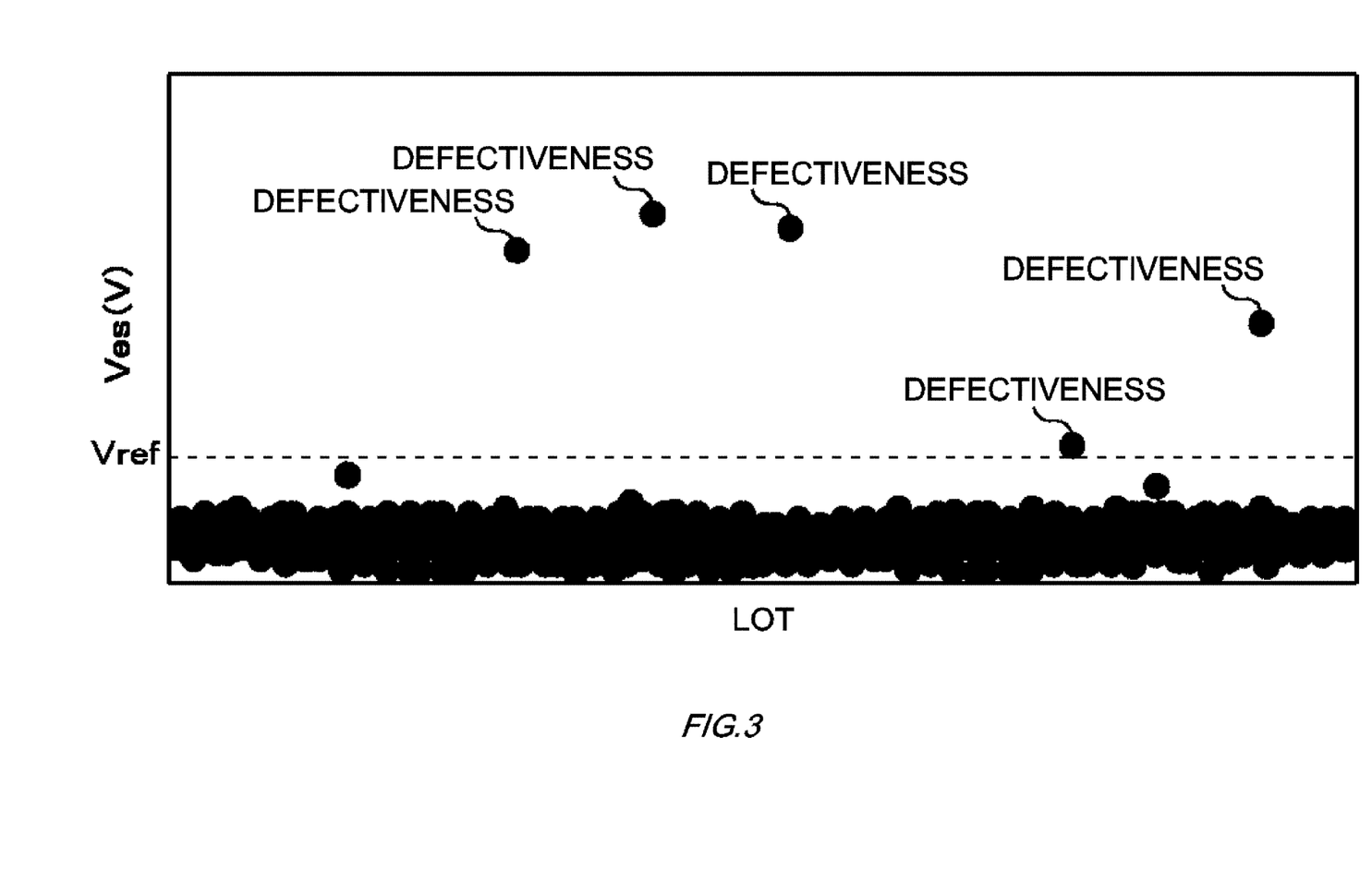
FIG. 3 illustrates measurement results of drop voltages Ves for a plurality of semiconductor modules 200.

FIG. 3 illustrates measurement results of the drop voltage Ves for a plurality of semiconductor modules 200. In FIG. 3, a horizontal axis indicates a lot of the semiconductor module 200, and a vertical axis indicates the drop voltage Ves.

In the test of the semiconductor module 200, when the drop voltage Ves during the diode operation of the main element portion 150 exceeds a predetermined reference value Vref, the semiconductor module 200 may be determined as defective to be screened out. However, if defective products are screened out in the state of semiconductor module 200, manufacturing costs incurred up to this point will be wasted. Therefore, it is preferred that the semiconductor device 100 with a portion such as the defect 93 can be screened out before being embedded into the semiconductor module 200.

Figure 4:
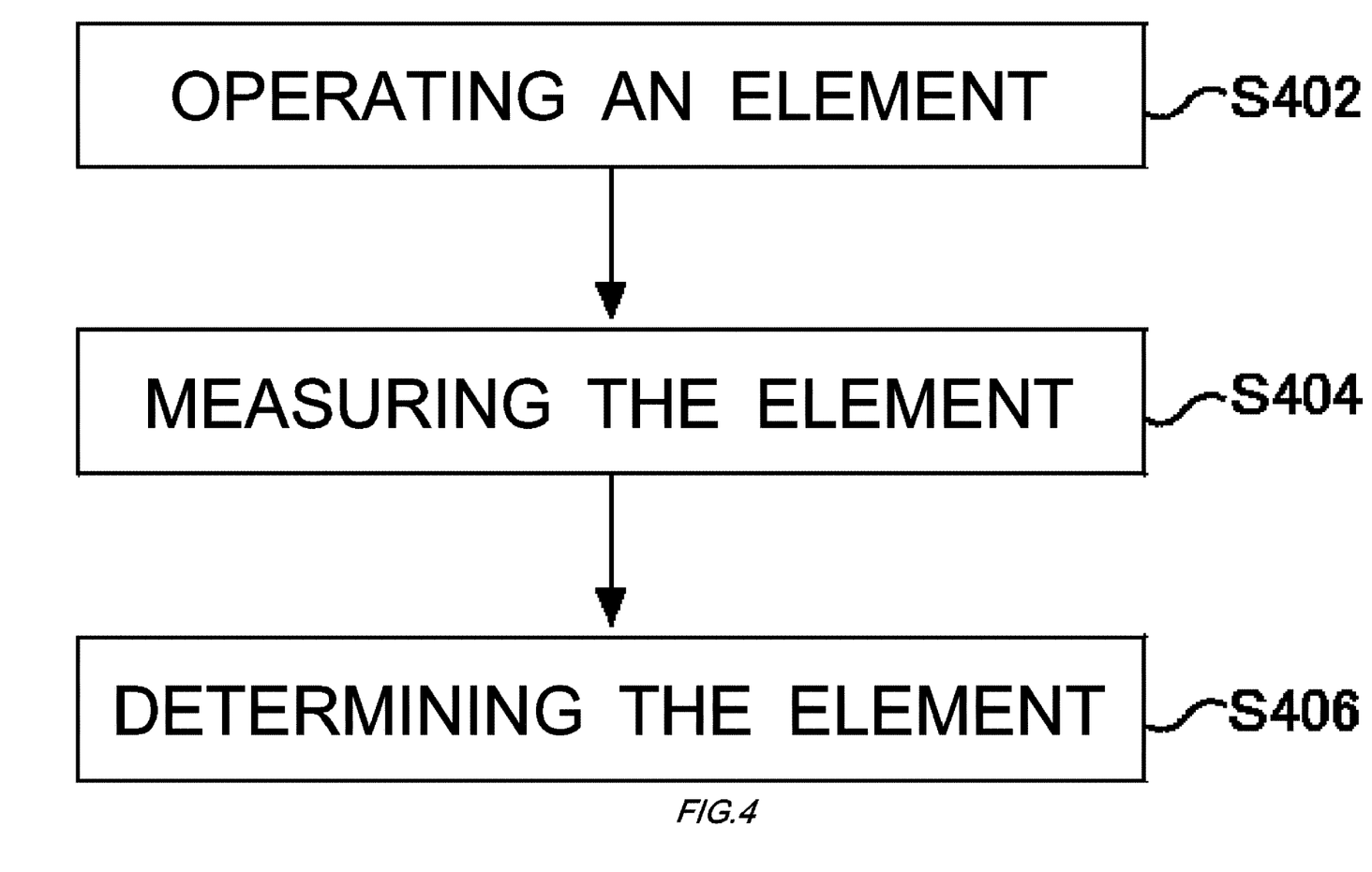
FIG. 4 illustrates a testing method of a semiconductor device 100 according to one embodiment of the present invention.

FIG. 4 illustrates a testing method of the semiconductor device 100 according to one embodiment of the present invention. In the present specification, the test of the semiconductor device 100 may be referred to as an element test or testing an element. The testing method in the present example includes operating an element S402, measuring an element S404 and determining an element S406.

Figure 5:
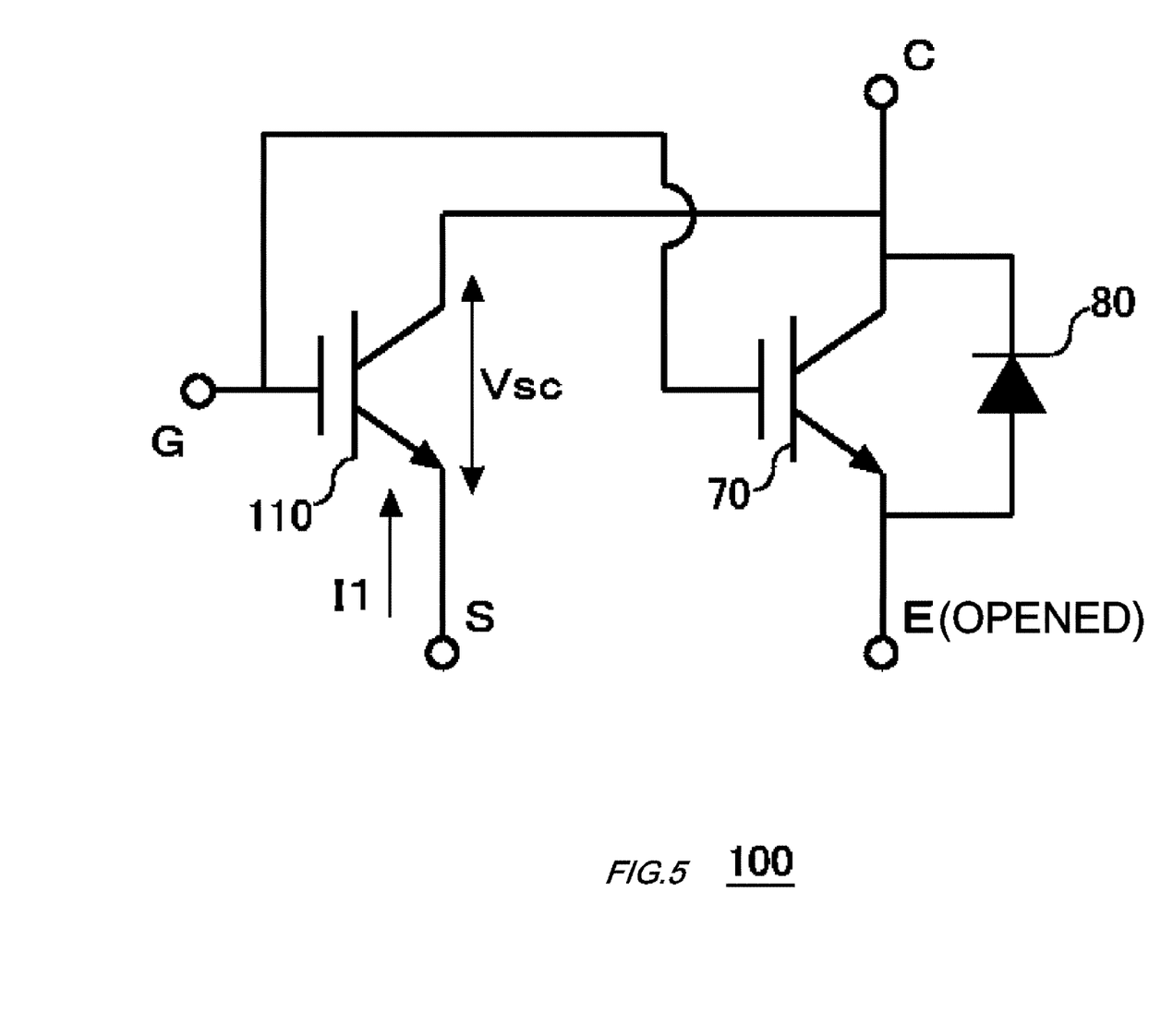
FIG. 5 illustrates an example of operating an element S402 and measuring an element S404.

FIG. 5 illustrates an example of operating the element S402 and measuring the element S404. During operating the element S402 in the present example, in the semiconductor device 100 in a chip or wafer state, the diode operation of the sensing transistor portion 110 is caused. The chip state refers to a state of a chip singulated by cutting the semiconductor device 100 from the semiconductor wafer in which a plurality of semiconductor devices 100 are formed, and a state of not being embedded in the semiconductor module 200. The wafer state also refers to a state of the semiconductor device 100 provided in the semiconductor wafer not being cut from the semiconductor wafer. A plurality of semiconductor devices 100 are formed in the semiconductor wafer. Each semiconductor device 100 has the structure described in FIG. 1 in either of the chip state or the wafer state. In the semiconductor device 100, all electrodes such as an emitter electrode, a collector electrode, a gate electrode, and a sensing electrode are provided.

Also, the diode operation of the sensing transistor portion 110 refers to applying a gate voltage for controlling the sensing transistor portion 110 to be in the OFF state and causing a predetermined current to flow from the sensing electrode (terminal S) to the collector electrode (terminal C). In the example in FIG. 5, the first test current I1 flows through the sensing transistor portion 110.

As shown in FIG. 1, when the diode operation of the sensing transistor portion 110 of the semiconductor device 100 without the defect 93 is caused, the current flows along the current path 91. On the other hand, when the diode operation of the sensing transistor portion 110 of the semiconductor device 100 with the defect 93 is caused, the current flows along the current path 92. Since the length of the current path varies according to the presence or absence of the defect 93 and the position of the defect 93, the diode characteristic of the sensing transistor portion 110 varies accordingly. Therefore, by measuring the diode characteristic of the sensing transistor portion 110, similar to measuring the drop voltage Ves in the semiconductor module 200, a test to determine the presence or absence of the defect 93 or the like can be performed. The diode characteristic refers to, for example, voltage-current characteristic showing the relationship between a voltage between main terminals of the sensing transistor portion 110 (Vsc) and the current flowing through the main terminal (I1). The main terminals of the sensing transistor portion 110 refer to the sensing electrode (terminal S) and the collector electrode (terminal C).

In measuring the element S404, the voltage-current characteristic is measured. In measuring the element S404, the current (I1) with respect to one voltage (Vsc) may be measured, or the current (I1) with respect to each of a plurality of voltages (Vsc) may be measured.

In operating the element S402, the voltage-current characteristic of the sensing transistor portion 110 is preferably measured while at least one of the main terminals of the main element portion 150 is opened. In the present example, the E terminal (emitter electrode) is in an open state. In this way, the voltage-current characteristic of the sensing transistor portion 110 can be measured accurately without operating the main element portion 150.

Figure 6:
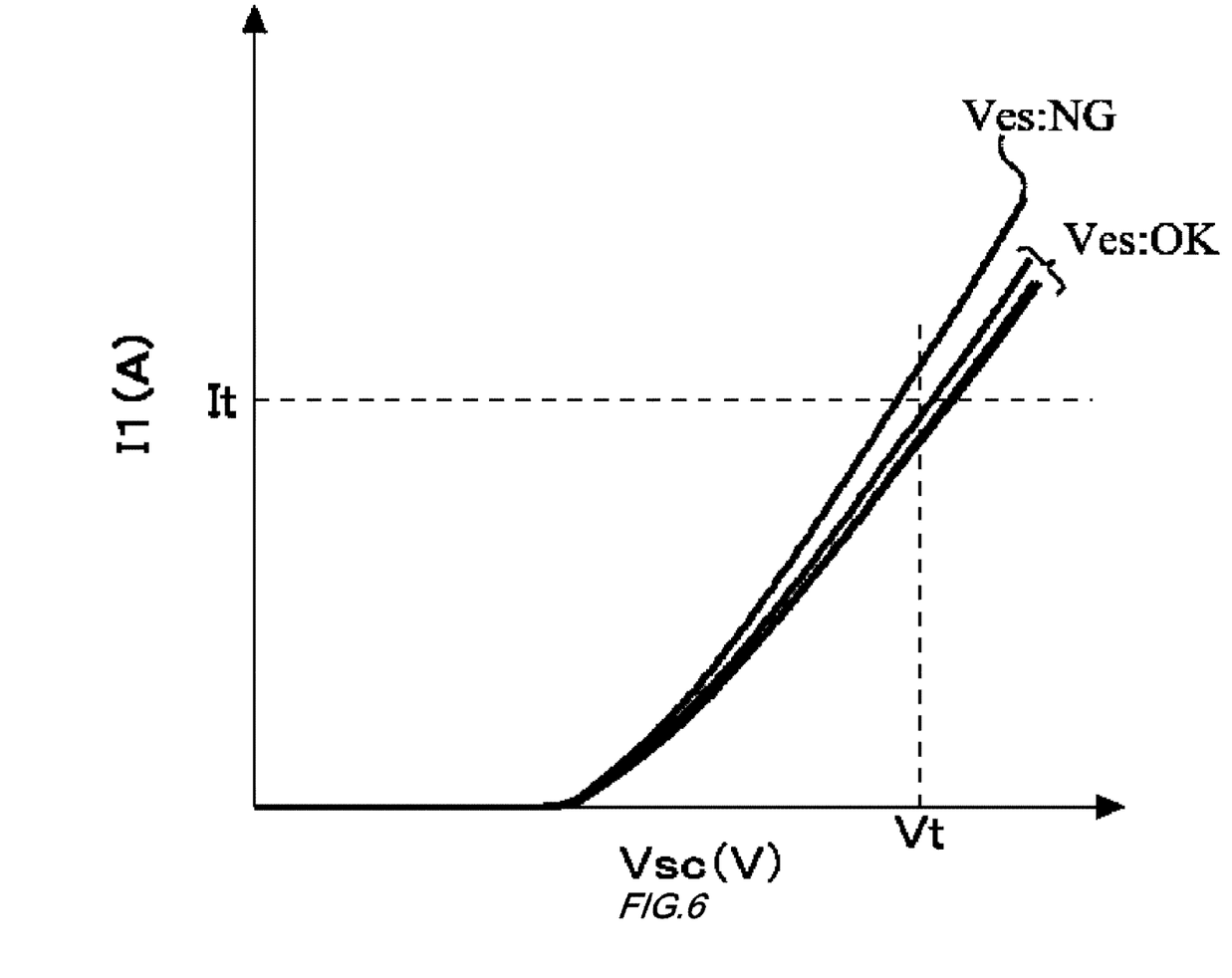
FIG. 6 illustrates a measurement example of a voltage-current characteristic of a sensing transistor portion 110 in a plurality of semiconductor devices 100.

FIG. 6 illustrates a measurement example of the voltage-current characteristic of the sensing transistor portion 110 in the plurality of semiconductor devices 100. As described above, according to the presence or absence of the defect 93 and the position of the defect 93 and so on, the voltage-current characteristic of the sensing transistor portion 110 varies.

In determining the element S406, based on the voltage-current characteristic of the sensing transistor portion 110, the defectiveness of the semiconductor device 100 is determined. In determining the element S406, by comparing a preset reference characteristic and the measured voltage-current characteristic, the defectiveness of the semiconductor device 100 may be determined.

For example, in determining the element S406, the defectiveness of each of the semiconductor devices 100 is determined based on the first test current I1 when a predetermined testing voltage Vt is applied between main terminals of the sensing transistor portion 110. The combination of the testing voltage Vt and the first test current I1 corresponds to the voltage-current characteristic. In determining the element S406, if the first test current I1 when the testing voltage Vt is applied exceeds the predetermined threshold current It, the semiconductor device 100 may be determined to be defective. The threshold current It corresponds to the reference characteristic described above.

The threshold current It is preferably set to be capable to distinguish the voltage-current characteristic of the semiconductor device 100 that is determined to be defective in the test using the drop voltage Ves (Ves: NG), and the voltage-current characteristic of the semiconductor device 100 that is determined to be non-defective in the test using the drop voltage Ves (Ves: OK).

It is easier for the first test current I1 to flow through the semiconductor device 100 determined to be defective in the test using the drop voltage Ves when compared to the semiconductor device 100 determined to be non-defective. Therefore, the voltage-current characteristic of the defective sensing transistor portion 110 shifts toward the upper side (the direction of the current becoming larger) when compared to the voltage-current characteristic of the non-defective sensing transistor portion 110. Therefore, by setting the threshold current It properly, similar to the test using the drop voltage Ves, the defectiveness can be detected according to the presence or absence and the position of the defect 93, and so on.

Also, the threshold current It may be set to have a value corresponding to the reference value Vref that should be used in the test of the semiconductor module 200. The reference value Vref may be a specification value required with respect to the semiconductor module 200. By decreasing the threshold current It, the ratio of the semiconductor device 100 being determined as defective in the test using the voltage-current characteristic increases. Similarly, by decreasing the reference value Vref, the ratio of the semiconductor device 100 being determined as defective in the test using the drop voltage Ves increases. The threshold current It may be set so that the ratio of the semiconductor device determined to be defective in the test comparing the drop voltage Ves to the reference value Vref matches the ratio of the semiconductor device determined to be defective in the test using the voltage-current characteristic. The relationship between the reference value Vref and the threshold current It is preferably acquired in advance by experiments or simulations.

As described in FIG. 1 to FIG. 6, by performing the test on the semiconductor device 100 in a chip or wafer state using the voltage-current characteristic of the sensing transistor portion 110, the semiconductor device 100 in a chip or wafer state can be screened out in advance. Therefore, the defective rate can be reduced in the semiconductor module 200, and the manufacturing costs can also be reduced. Also, the test using the voltage-current characteristic of the sensing transistor portion 110 can replace the test using the drop voltage Ves of the semiconductor module 200. The test using the drop voltage Ves of the semiconductor module 200 may be performed, or may be omitted.

Note that the first test current I1 may be smaller than a rated current of the main element portion 150. The rated current of the main element portion 150 may be the rated current when the diode operation of the main element portion 150 is caused. The voltage-current characteristic of the sensing transistor portion 110 can still be measured even if the first test current I1 is smaller than the rated current of the main element portion 150. In operating the element S402 and measuring the element S404, it can be contemplated to bring the probe for the test into direct contact with the C terminal and the S terminal of the semiconductor device 100 and apply the voltage and current. Since the relatively small first test current I1 is used in the present example, even if the contact resistance between the terminal of the semiconductor device 100 and the probe for the test is high, it is easy to supply a current to the semiconductor device 100. The first test current I1 may be half or less, or may be 1/10 or less, of the rated current of the main element portion 150. The first test current I1 may be half or less, or may be 1/10 or less, of the second test current I2.

Figure 7:
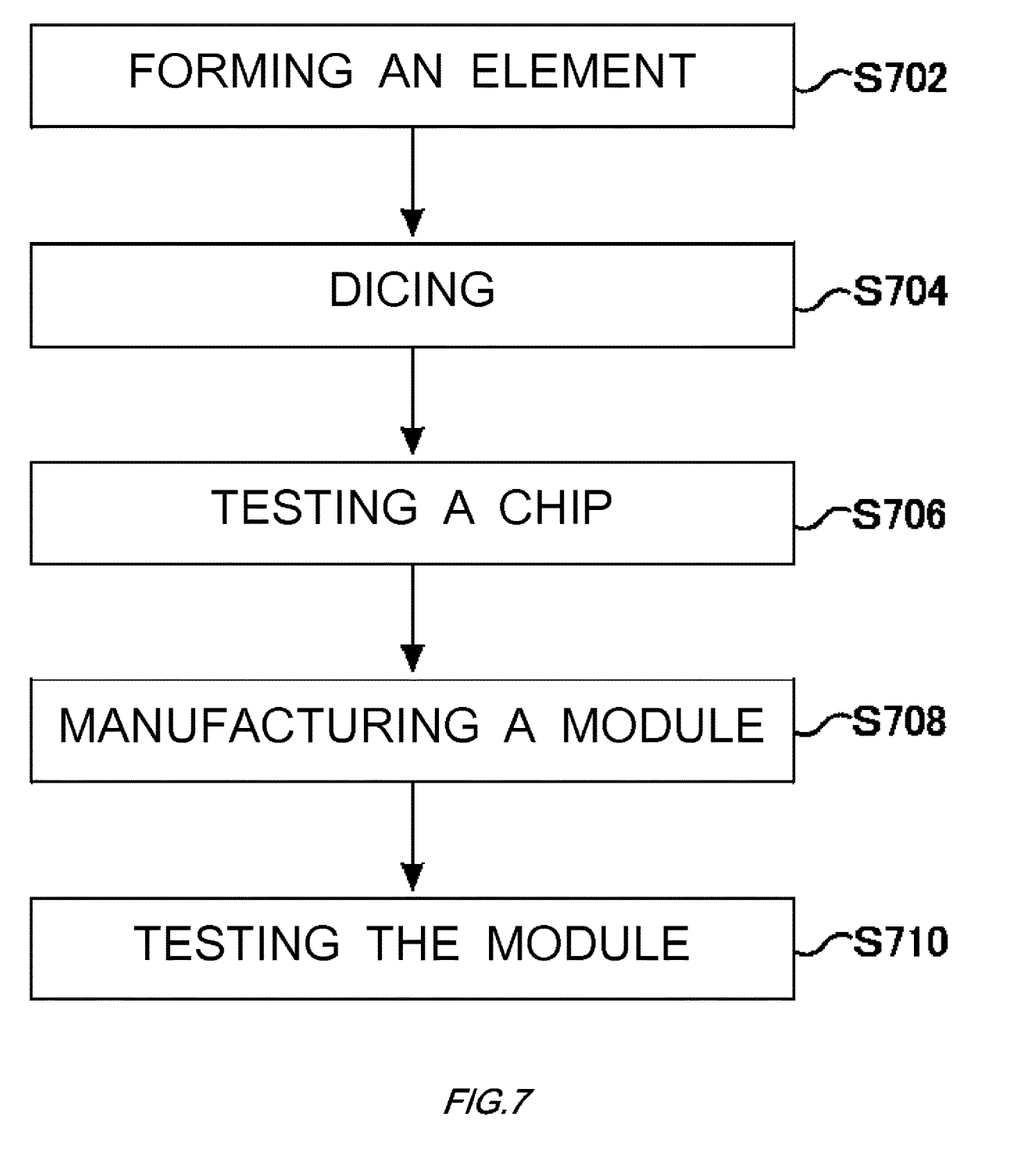
FIG. 7 illustrates an outline of a manufacturing method of the semiconductor module 200.

FIG. 7 illustrates an outline of a manufacturing method of the semiconductor module 200. The manufacturing method in the present example includes forming an element S702, dicing S704, testing a chip S706, manufacturing a module S708 and testing a module S710.

In forming the element S702, a plurality of semiconductor devices 100 are formed in the semiconductor substrate in a wafer state. In forming the element S702, the semiconductor device 100 in the wafer state may be tested. In forming the element S702, the element test described in FIG. 4 to FIG. 6 may be performed, or other tests may be performed.

In dicing S704, the plurality of semiconductor devices 100 are cut from the wafer and singulated (made into chips). In dicing S704, a process such as attaching a tape onto the wafer may be performed. Also, in dicing S704, the semiconductor device 100 determined as defective in the test in the wafer state may be sorted.

In testing the chip S706, the semiconductor device 100 in a chip state is tested. In testing the chip S706, the element test described in FIG. 4 to FIG. 6 may be performed, or other tests may be performed. Note that in at least one of forming the element S702 or testing the chip S706, the element test described in FIG. 4 to FIG. 6 is performed. In testing the chip S706, a visual test of the semiconductor device 100 may also be included.

In manufacturing the module S708, the semiconductor module 200 is manufactured using the semiconductor device 100 determined to be non-defective in each test up to testing the chip S706. The semiconductor module 200 may include one or more semiconductor devices 100, wiring, terminals, electrical elements and so on connected to the semiconductor device 100, and a resin case configured to accommodate the semiconductor device 100, wiring, terminals, electrical elements and so on.

In testing the module S710, the semiconductor module 200 is tested. In testing the module S710, the test described in FIG. 2 and FIG. 3 may be performed, or other tests may be performed. The semiconductor module 200 determined to be non-defective by testing the module S710 may be shipped.

In the present example, in at least one of forming the element S702 or testing the chip S706, the element test described in FIG. 4 to FIG. 6 is performed. Therefore, the ratio of defective semiconductor module 200 in testing the module S710 can be reduced, and the manufacturing costs can also be reduced. Also, the test described in FIG. 2 and FIG. 3 in testing the module S710 can be omitted.

Figure 8:
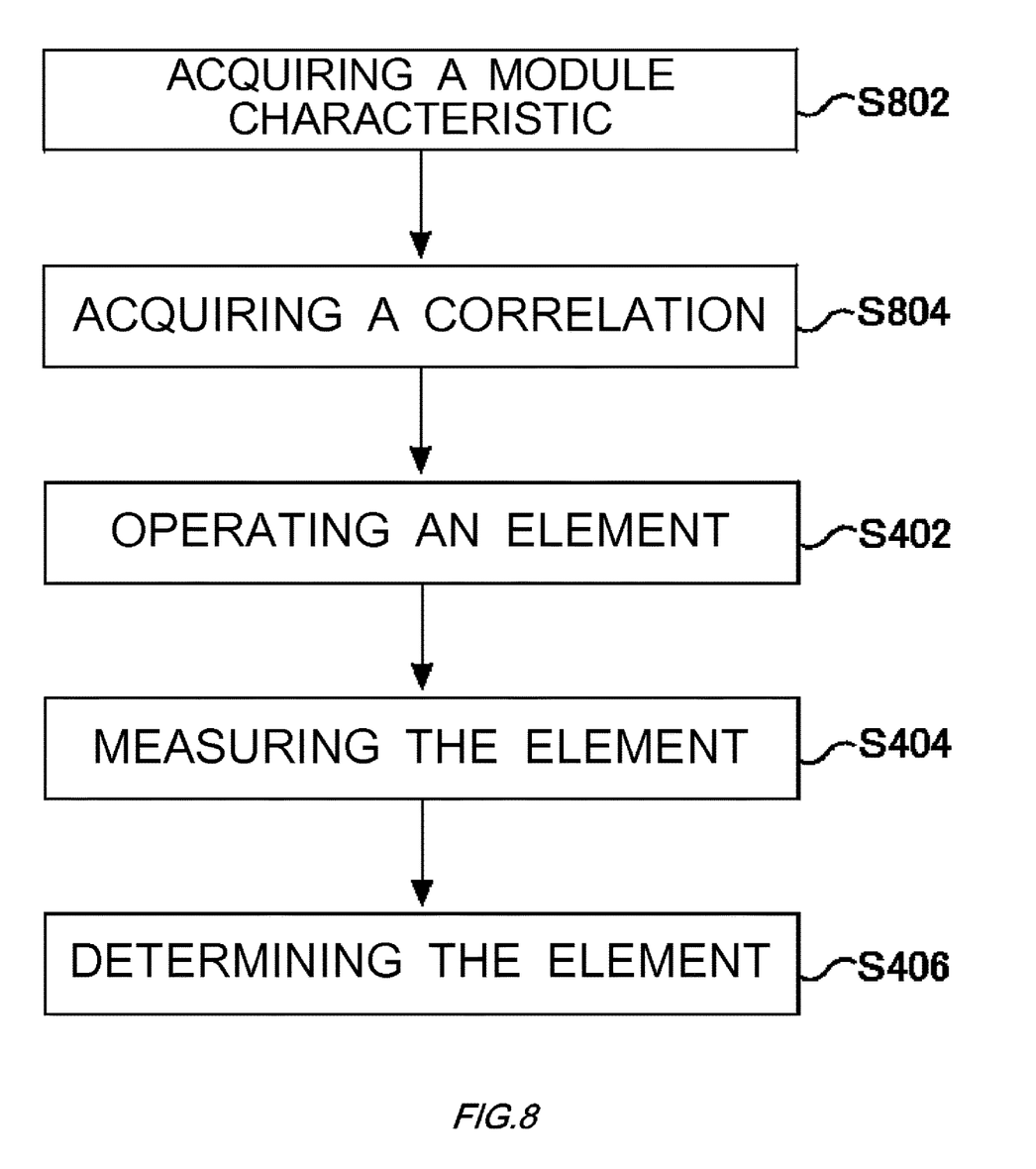
FIG. 8 illustrates another example of testing an element.

FIG. 8 illustrates another example of the element test. The element test in the present example further includes acquiring a module characteristic S802 and acquiring a correlation S804 in addition to the example described in FIG. 4. After acquiring the correlation S804, the processes after operating the element S402 described in FIG. 4 may be performed.

In acquiring the module characteristic S802, information related to the drop voltage Ves described in FIG. 2 with the semiconductor device 100 being embedded in the semiconductor module 200 is acquired. That is, the drop voltage Ves when the test current I2 flows through the main element portion 150 is measured in a state where a resistance 210 for current measurement is connected between the main terminal of the main element portion 150 (terminal E in the present example) and the main terminal of the sensing transistor portion 110 (terminal S in the present example). In acquiring the module characteristic S802, the reference semiconductor device having the same structure as the semiconductor device 100 under test may be embedded in the reference semiconductor module having the same structure as the semiconductor module 200 to measure the drop voltage Ves. In acquiring the module characteristic S802, the drop voltage Ves for each of the plurality of reference semiconductor devices may be measured. In acquiring the module characteristic S802, the drop voltage Ves may be measured for each of the reference semiconductor device in which the defect 93 is formed and the reference semiconductor device in which no defect 93 is formed.

In acquiring the correlation S804, the correlation between the drop voltage Ves and the voltage-current characteristic of the sensing transistor portion 110 is acquired. In acquiring the correlation S804, the voltage-current characteristic of the reference semiconductor device used in acquiring the module characteristic S802 may be measured in advance to acquire the correlation with the drop voltage Ves measured in acquiring the module characteristic S802.

For example, in acquiring the correlation S804, as shown in FIG. 6, the voltage-current characteristic of the reference semiconductor device where the drop voltage Ves satisfies the predetermined reference value (Ves: OK) may be distinguished from the voltage-current characteristic of the reference semiconductor device where the drop voltage Ves does not satisfy the predetermined reference value (Ves: NG).

After operating the element S402, similar to the example described in FIG. 4, the semiconductor device 100 under test is tested. Note that in determining the element S406, based on the correlation acquired in acquiring the correlation S804, the defectiveness of the semiconductor device 100 is determined. In determining the element S406 as described above, the voltage-current characteristic of the sensing transistor portion 110 is compared to the predetermined reference characteristics (for example, the threshold current It in FIG. 6) to determine the defectiveness of the semiconductor device 100. In determining the element S406 in the present example, the threshold current It is set based on the correlation described above. In determining the element S406, as shown in FIG. 6, the threshold current It is set so that the voltage-current characteristic where the drop voltage Ves satisfies the predetermined reference value (Ves: OK) can be distinguished from the voltage-current characteristic where the drop voltage Ves does not satisfy the predetermined reference value (Ves: NG). That is, the magnitude of the threshold current It is larger than the current with respect to the testing voltage Vt in the voltage-current characteristic in the non-defective case (Ves: OK), and smaller than the current with respect to the testing voltage Vt in the voltage-current characteristic in the defective case (Ves: NG). In this way, the result similar to the test using the drop voltage Ves can be obtained by the test using the voltage-current characteristic.

In operating the element S402 and measuring the element S404 described in FIG. 4 to FIG. 8, the testing voltage Vt applied between main terminals of the sensing transistor portion 110 may be from 4V to 6V. As shown in FIG. 6, the larger the testing voltage Vt, the larger the deviation between the current values of the voltage-current characteristic in the non-defective case (Ves: OK) and the voltage-current characteristic in the defective case (Ves: NG). Therefore, by increasing the testing voltage Vt, setting the threshold current It to determine the defectiveness becomes easier, also the accuracy of defectiveness determination is improved. The testing voltage Vt may be 4V or more, or may be 4.5V or more. On the other hand, if the testing voltage Vt and the first test current I1 becomes larger, the heat generation at the contact portion between the terminal of the semiconductor device 100 and the probe for the test is increased. The testing voltage Vt may be 6V or less, or may be 5.5V or less.

Also, in determining the element S406, at least one of the voltage-current characteristic of the sensing transistor portion 110 or the reference characteristics (for example, the threshold current It) may be compensated based on the structure of the semiconductor device 100. As an example, in determining the element S406, the threshold current It may be compensated for each lot of the semiconductor device 100. The voltage-current characteristics shown in FIG. 6 vary according to the structure parameter showing the structure of the semiconductor device 100. The structure parameter is, for example, the thickness of the semiconductor substrate 10, the doping concentration of each region of the base region 14, the drift region 18 and so on. The structure parameter may be a parameter affecting the resistance value of the current path when the sensing transistor portion 110 is under diode operation. When the resistance value of the current path varies, the voltage-current characteristic varies.

In determining the element S406, the value of the structure parameter in each lot of the semiconductor device 100 may be acquired. The value may be an average value within the lot. In determining the element S406, based on the value of the structure parameter of the lot, the threshold current It for the semiconductor device 100 belonging to the lot may be compensated. The relationship between the structure parameter value and the threshold current It value to be used may be acquired by experiments in advance, or may be acquired by simulations and so on. Also, instead of compensating the threshold current It, compensating the voltage-current characteristic may also obtain the similar effect.

Figure 9:
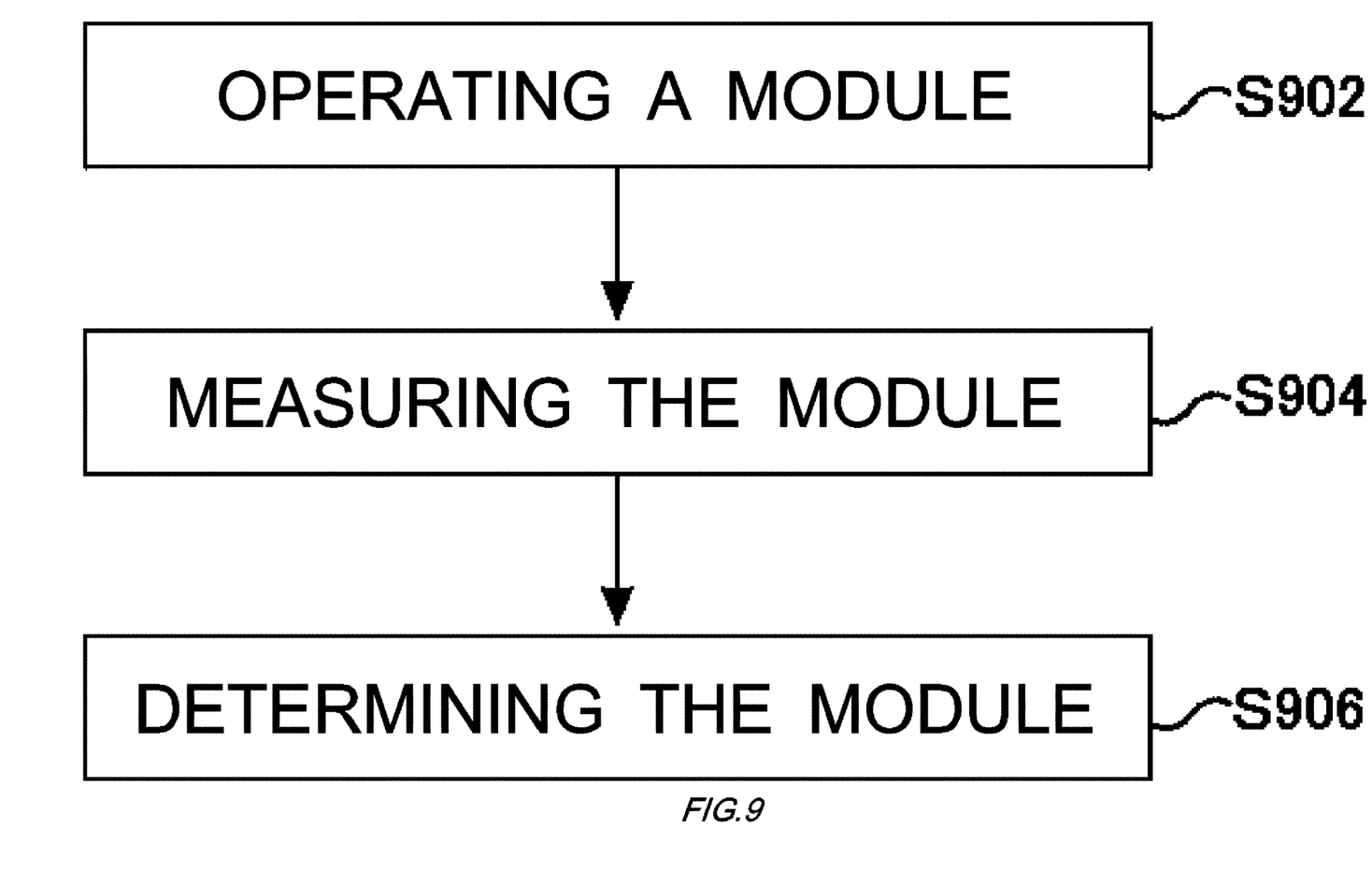
FIG. 9 illustrates an example of a testing case performed during testing a module S710.

FIG. 9 illustrates an example of the testing case performed in testing the module S710. In testing the module S710 in the present example, the test described in FIG. 2 and FIG. 3 is performed. Testing the module S710 in the present example includes operating a module S902, measuring a module S904 and determining a module S906.

In operating the module S902, the semiconductor module 200 embedding the semiconductor device 100 determined to be non-defective in determining the element S406 is operated as described in FIG. 2. That is, in operating the module S902, the second test current I2 flows through the main element portion 150 in a state where the resistance 210 for current measurement is connected between the main terminal of the main element portion 150 (terminal E in the present example) and the main terminal of the sensing transistor portion 110 (terminal S in the present example). As described in FIG. 2, in operating the module S902 and measuring the module S904, the main transistor portion 70 and the sensing transistor portion 110 are controlled to be in the OFF state. Also, the second test current I2 is the current in the forward direction with respect to the main diode portion 80.

In measuring the module S904, the drop voltage Ves in the resistance 210 when the second test current I2 flows through the main element portion 150 is measured. The semiconductor module 200 may have a terminal for measuring the voltage between the two terminals of the resistance 210.

In determining the module S906, the defectiveness of the semiconductor module 200 is determined based on the drop voltage Ves. In determining the module S906, as described in FIG. 3, the defectiveness of the semiconductor module 200 may be determined based on whether the drop voltage Ves exceeds the predetermined reference value Vref. The semiconductor module 200 determined to be non-defective in determining the module S906 may be shipped. As described in FIG. 1 to FIG. 8, by performing the test on the semiconductor device 100 in the wafer state or the chip state using the voltage-current characteristic of the sensing transistor portion 110, the test, which is equivalent to the test using the drop voltage Ves in the semiconductor module 200, can be performed in advance. Therefore, the ratio of the semiconductor module 200 determined to be defective in determining the module S906 can be reduced, and the manufacturing costs can also be reduced.

In the element test described in FIG. 4 or FIG. 8, the plurality of semiconductor devices 100 may be tested in parallel. For example, the element test may be performed by bringing the probe for the measurement into contact with each of the plurality of semiconductor devices 100 in a wafer state. Since the relatively small first test current I1 is used in the element test, it is relatively easy to test the plurality of semiconductor devices 100 in parallel.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A testing method for testing a semiconductor device, the testing method comprising:
   providing the semiconductor device, which includes a main element portion that includes a main transistor portion and a main diode portion, and a sensing transistor portion, the sensing transistor portion being capable of being selectively placed in an ON state and an OFF state, the semiconductor device further including a semiconductor substrate having an upper surface and a lower surface, wherein a transistor portion lower region of the semiconductor substrate covering a corresponding area in plan view comprising an area corresponding in plan view to the main transistor portion in its entirety and an area corresponding in plan view to the sensing transistor portion in its entirety, and which is in contact with the lower surface, is only of a first conductivity type;
   operating the semiconductor device such that the sensing transistor portion is in the OFF state, wherein the semiconductor device includes a sensing electrode and a collector electrode, wherein the sensing transistor portion is provided with main terminals, and wherein the sensing electrode and the collector electrode provide for the main terminals of the sensing transistor portion;
   measuring a voltage-current characteristic between the main terminals of the sensing transistor portion in the OFF state by measuring a current I1 flowing through the main terminals of the sensing transistor portion for each of one or more values of a voltage Vsc between the main terminals of the sensing transistor portion; and
   determining whether or not a defect is present in the semiconductor device based on the voltage-current characteristic.

2. The testing method according to claim 1, wherein the main element portion is provided with main terminals, and wherein in the measuring the voltage-current characteristic, the voltage-current characteristic is measured in a state where at least one of the main terminals of the main element portion is opened.

3. The testing method according to claim 2, wherein in the operating the semiconductor device, a first test current, which is smaller than a rated current of the main element portion, flows through the sensing transistor portion.

4. The testing method according to claim 2, wherein
   in the determining whether or not a defect is present, the voltage-current characteristic is compared to a reference characteristic to determine whether or not the semiconductor device is defective;
   in the determining whether or not a defect is present, at least one of the voltage-current characteristic or the reference characteristic is compensated based on a structure of the semiconductor device.

5. The testing method according to claim 2, wherein in the operating the semiconductor device, the voltage applied between the main terminals of the sensing transistor portion is set to be from 4V to 6V.

6. The testing method according to claim 1, wherein in the operating the semiconductor device, a first test current, which is smaller than a rated current of the main element portion, is caused to flow through the sensing transistor portion.

7. The testing method according to claim 6, wherein
   in the determining whether or not a defect is present, the voltage-current characteristic is compared to a reference characteristic to determine whether or not the semiconductor device is defective;
   in the determining whether or not a defect is present, at least one of the voltage-current characteristic or the reference characteristic is compensated based on a structure of the semiconductor device.

8. The testing method according to claim 6, further comprising:
   acquiring a module characteristic by acquiring a drop voltage in a resistance for current measurement when a current flows through the main element portion in a state where the resistance for current measurement is connected between a main terminal of the main element portion and a main terminal of the sensing transistor portion in a semiconductor module having the semiconductor device embedded therein; and acquiring a correlation between the drop voltage and the voltage-current characteristic, wherein in the determining whether or not a defect is present, the voltage-current characteristic is compared to a reference characteristic determined according to the correlation to determine whether or not the semiconductor device is defective.

9. A testing method for testing a semiconductor device, the semiconductor device including a main element portion that includes a main transistor portion and a main diode portion, and a sensing transistor portion, the semiconductor device having been determined to be non-defective in accordance with the testing method of claim 6 and the semiconductor device being embedded in a semiconductor module, the testing method comprising:

measuring a drop voltage in a resistance for current measurement when a second test current flows through the main element portion in a state where the resistance for current measurement is connected between a main terminal of the main element portion and a main terminal of the sensing transistor portion; and determining whether or not the semiconductor module is defective based on the drop voltage by comparing the drop voltage to a reference characteristic.

10. The testing method according to claim 6, wherein in the operating the semiconductor device, the voltage applied between the main terminals of the sensing transistor portion is set to be from 4V to 6V.

11. The testing method according to claim 1, wherein
in the determining whether or not a defect is present, the voltage-current characteristic is compared to a reference characteristic to determine whether or not the semiconductor device is defective;
in the determining whether or not a defect is present, at least one of the voltage-current characteristic or the reference characteristic is compensated based on a structure of the semiconductor device.

12. A testing method for testing a semiconductor device, the semiconductor device including a main element portion that includes a main transistor portion and a main diode portion, and a sensing transistor portion, the semiconductor device having been determined to be non-defective in accordance with the testing method of claim 11 and the semiconductor device being embedded in a semiconductor module, the testing method comprising:

measuring a drop voltage in a resistance for current measurement when a test current flows through the main element portion in a state where the resistance for current measurement is connected between a main terminal of the main element portion and a main terminal of the sensing transistor portion; and determining whether or not the semiconductor module is defective based on the drop voltage by comparing the drop voltage to the reference characteristic.

13. The testing method according to claim 11, wherein in the operating the semiconductor device, the voltage applied between the main terminals of the sensing transistor portion is set to be from 4V to 6V.

14. The testing method according to claim 1, further comprising:
acquiring a module characteristic by acquiring a drop voltage in a resistance for current measurement when a current flows through the main element portion in a state where the resistance for current measurement is connected between a main terminal of the main element portion and a main terminal of the sensing transistor portion in a semiconductor module having the semiconductor device embedded therein; and acquiring a correlation between the drop voltage and the voltage-current characteristic, wherein in the determining whether or not a defect is present, the voltage-current characteristic is compared to a reference characteristic determined according to the correlation to determine whether or not the semiconductor device is defective.

15. A testing method for testing a semiconductor device, the semiconductor device including a main element portion that includes a main transistor portion and a main diode portion, and a sensing transistor portion, the semiconductor device having been determined to be non-defective in accordance with the testing method of claim 14 and the semiconductor device being embedded in a semiconductor module, the testing method comprising:

measuring a drop voltage in a resistance for current measurement when a test current flows through the main element portion in a state where the resistance for current measurement is connected between a main terminal of the main element portion and a main terminal of the sensing transistor portion; and determining whether or not the semiconductor module is defective based on the drop voltage by comparing the drop voltage to a reference characteristic.

16. A testing method for testing a semiconductor device, the semiconductor device including a main element portion that includes a main transistor portion and a main diode portion, and a sensing transistor portion, the semiconductor device having been determined to be non-defective in accordance with the testing method of claim 1 and the semiconductor device being embedded in a semiconductor module, the testing method comprising:

measuring a drop voltage in a resistance for current measurement when a test current flows through the main element portion in a state where the resistance for current measurement is connected between a main terminal of the main element portion and a main terminal of the sensing transistor portion; and determining whether or not the semiconductor module is defective based on the drop voltage by comparing the drop voltage to a reference characteristic.

17. The testing method according to claim 1, wherein in the operating the semiconductor device, the voltage applied between the main terminals of the sensing transistor portion is set to be from 4V to 6V.

18. A manufacturing method for manufacturing a semiconductor module having embedded a semiconductor device therein, the manufacturing method comprising:
testing the semiconductor device by the testing method according to claim 1; and
manufacturing the semiconductor module using the semiconductor device determined to be non-defective in the testing the semiconductor device.

19. The testing method according to claim 1, wherein in determining whether or not a defect is present, I1 is determined for a corresponding value for Vsc that is given by a predetermined testing voltage Vt and a defect is determined to be present in the semiconductor device when I1 at Vt exceeds a predetermined threshold current It, in order to screen out the semiconductor device from being used in further manufacturing steps when a defect is determined to be present in the semiconductor device.

20. The testing method according to claim 1, wherein the semiconductor device is in a chip or wafer state.

21. The testing method according to claim 1, wherein the main diode portion is provided in the semiconductor substrate, wherein in the main diode portion, a cathode region of a second conductivity type is provided in contact with the lower surface and a collector region of the first conductivity type is not provided, and the sensing transistor portion and the main diode portion are arranged such that the sensing transistor portion and the main diode portion are intervened by the main transistor portion.

* * * * *